Oct. 8, 1963

K. ROLLIG 3,106,689

ELECTRICAL FILTER FOR DIRECT CURRENT CIRCUIT

Filed Oct. 24, 1960

INVENTOR.
Karl Rollig
BY
Pierce, Scheffler & Parker
Attorneys

United States Patent Office 3,106,689
Patented Oct. 8, 1963

3,106,689
ELECTRICAL FILTER FOR DIRECT CURRENT CIRCUIT

Karl Rollig, Baden, Aargau, Switzerland, assignor to Aktiengesellschaft Brown, Boveri & Cie, Baden, Switzerland, a joint-stock company Filed Oct. 24, 1960, Ser. No. 64,611
Claims priority, application Switzerland Nov. 20, 1959
8 Claims. (Cl. 333—79)

This invention relates to an improvement in electrical filters and more particularly to filters which are used for direct current circuits. An object of the invention is to provide an improved filter circuit arrangement wherein the capacitance elements used in the circuit are relieved from the full direct current voltage which is applied to the filter input.

As is well known, electric filters for filtering or screening out certain frequencies are used in direct current circuits for the purpose of reducing to a minimum the ripple in the outputs of rectifiers of all kinds due to harmonics which arise. Such filters preferably comprise inductances and capacitances. In most cases, one connects the capacitances in parallel with the direct current circuit and the inductances in series with it. The full voltage of the direct current circuit is thus applied to the capacitances and hence they must be designed to withstand this voltage.

In accordance with the invention, the capacitance elements used in the filter circuit are relieved from the full voltage of the direct current circuit and this object is attained by connecting an auxiliary direct current voltage source in series with at least one of the capacitances in the filter circuit in such manner that the voltage to which the capacitance is subjected is less than the input voltage applied to the entire filter.

The foregoing as well as other objects and advantages of the invention will become more apparent from the following detailed description of several practical embodiments thereof and from the accompanying drawings.

Figure 1:
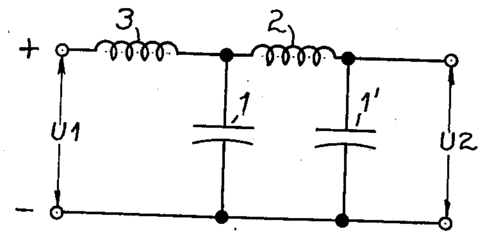
Fig-1 PRIOR ART
FIG. 1 is a schematic electrical circuit diagram illustrating a conventional electrical filter and which has been included for the purpose of distinguishing the present inventive concept.

A conventional filter circuit is shown in FIG. 1. There it will be seen that there are two capacitance elements 1 and 1′ connected in parallel with the direct current circuit to which is applied a direct current voltage U1 which is assumed to contain harmonics. An inductance 2 is connected in series with the circuit and is illustrated as being located between the capacitances 1 and 1′. Connected ahead of the filter circuit, and in series with the direct current circuit is an additional inductance 3. The filtered voltage at the output of the filter circuit is designated U2. As is obvious from this circuit, the capacitances 1 and 1′ are subjected to the entire voltage U1 and hence the disadvantage is that they must be designed to withstand it. This requires, especially at high operating voltages, a high electrical strength which increases the structural dimensions of the capacitance elements.

Figure 2:
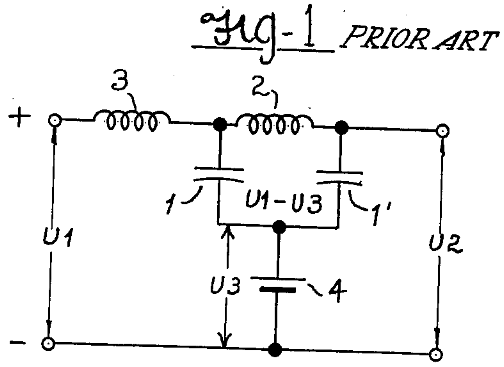
FIG. 2 is a similar circuit diagram illustrating one embodiment of an electrical filter in accordance with the invention.

An embodiment of the improved filter circuit in which the capacitance elements are not required to withstand the full voltage applied to the filter is illustrated in FIG. 2. In this view, it will be seen that the inductance elements 2 and 3 are arranged as in the FIG. 1 circuit. However, the two mutually parallel capacitance elements 1 and 1′ are each connected in series with an auxiliary direct current voltage source 4, illustrated as a battery, the auxiliary voltage source 4 being arranged in opposition to the higher voltage U1 applied to the entire filter circuit. Thus, if the voltage at the source 4 be designated U3, then the actual voltage applied to the capacitances 1 and 1′ is represented by the difference between the voltages U1 and U3. In other words, the voltage which the capacitances must now withstand is approximately the voltage U1, U2, respectively, decreased by the voltage U3. Owing to this, it is now possible to design the capacitances for only this smaller direct current voltage. If voltage U3 is made approximately equal to voltage U1 or U2, there is practically no direct current voltage on the capacitances, and these need to be designed only for the alternating component in the voltage applied to the filter.

Figures 3, 4:
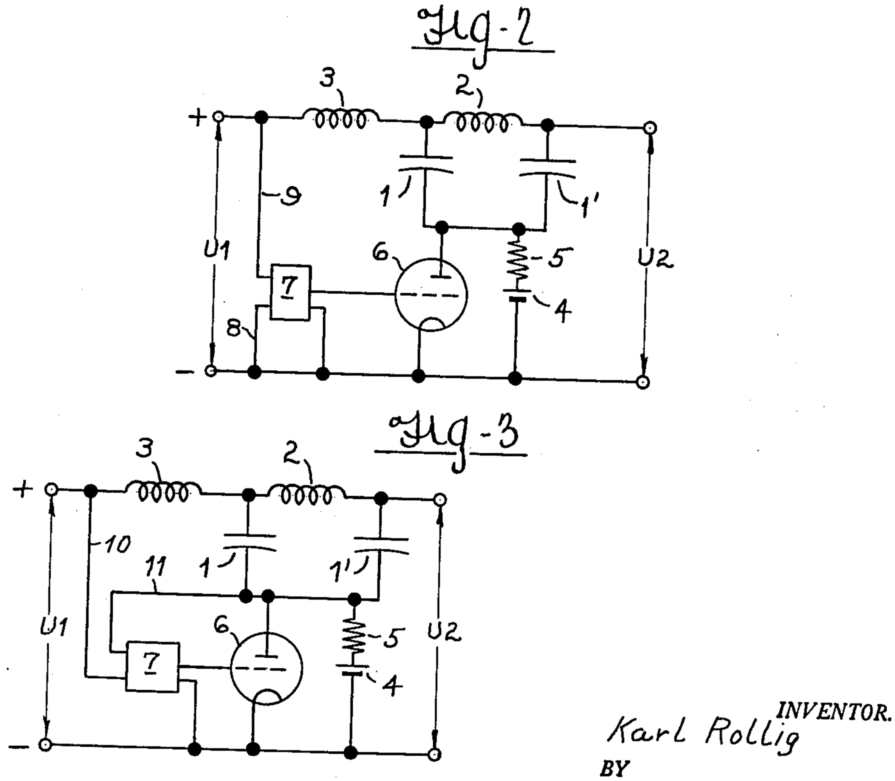
FIG. 3 is a similar circuit diagram illustrating another embodiment of the invention.
FIG. 4 is also a circuit diagram illustrating a modification for the arrangement shown in FIG. 3.

In direct current networks having a variable voltage, the auxiliary direct current voltage must be regulated with the direct current voltage of the network in order that a compensation as good as possible will be obtained for all values of the direct current voltage. One suitable embodiment of the invention which attains this result is illustrated in FIG. 3. This circuit is similar to that of FIG. 2 so far as the basic arrangement is concerned, i.e. use of an auxiliary direct current voltage source 4 connected in series to the paralleled capacitances 1 and 1′ and in opposition to the voltage applied to the filter. However, the circuit differs from FIG. 2 in that a load resistance element 5 is connected in series with the auxiliary voltage source 4 and a variable electronic impedance, e.g. an electronic tube in the form of a triode 6 has its cathode-anode circuit connected across the series arrangement of source 4 and load resistance 5. Variation in the voltage applied to the control grid of tube 6 will cause a variation in the impedance of the cathode-anode circuit which thus constitutes a variable load on the auxiliary voltage source 4, and because of this variable load, a correspondingly variable voltage drop occurs in the resistance element 5 through which the anode current flows which in turn effects a corresponding change in the voltage applied to the capacitances 1 and 1′. Control of the voltage applied to the grid element of tube 6 can be obtained from the direct current voltage U1 applied to the filter circuit and which is applied to the input of a control device 7 by means of conductors 8 and 9.

If instead of the voltage U1 to control the grid voltage at the output of the control device 7, it is desired to use the voltage on the capacitances 1 and 1′ for this purpose, the modified embodiment shown in FIG. 4 is used. This embodiment is similar to that of FIG. 3 except that the input to the control device 7 is constituted by the voltage applied to capacitances 1 and 1′ and which is led to the control device 7 by means of conductors 10 and 11. In this embodiment as well as that of FIG. 3, in order that the control device 7 itself will not be influenced by any existing harmonics, an additional filter device is preferably installed in the control device 7.

If desired, the embodiments of FIGS. 3 and 4 can be constructed by using an equivalent transistor circuit in lieu of the electronic tube circuit which has been described as the variable load for the auxiliary voltage source 4.

In conclusion, the advantage of the improved filter arrangement according to the invention is that for the design of the capacitance elements, only the harmonic voltage rather than the full direct current voltage applied to the filter circuit has to be considered. As explained at the outset, because of this improved arrangement, the capacitances can be made much smaller and hence one saves in structural costs of these elements of the filter.

I claim:

1. In an electric filter for direct current circuits comprising at least one capacitance element connected in parallel with said circuit, the improvement wherein an auxiliary direct current voltage source is connected in series with the capacitance element, said auxiliary voltage source being arranged in opposition to the direct current input voltage applied to the filter for filtering whereby the voltage to which said capacitance is subjected is smaller than said input voltage.

2. An electric filter as defined in claim 1 wherein the amplitude of said auxiliary voltage source is variable.

3. An electric filter as defined in claim 1 and which further includes a resistance element connected in series with said auxiliary voltage source and a variable electronic impedance connected in circuit with said series arranged resistance element and auxiliary voltage source for varying the amount of current flowing through said resistance element and hence varying the voltage drop across the same.

4. An electric filter as defined in claim 3 wherein said electronic impedance is controlled by said direct current input voltage.

5. An electric filter as defined in claim 3 wherein said variable electronic impedance is constituted by a grid-controlled tube, the grid voltage being controlled by said direct current input voltage.

6. An electric filter as defined in claim 3 wherein said variable electronic impedance is constituted by a grid-controlled tube, the control voltage for the grid being derived from said direct current input voltage and being applied to the grid over an additional filter device.

7. An electric filter as defined in claim 3 wherein said electronic impedance is controlled by the voltage applied to said capacitance element.

8. An electric filter as defined in claim 3 wherein said variable electronic impedance is constituted by a grid-controlled tube, the control voltage for the grid being derived from the voltage applied to the capacitance element and being connected to the grid over an additional filter device.

References Cited in the file of this patent

UNITED STATES PATENTS 2,751,548 Gunderson ------------- June 19, 1956